(12) United States Patent
Zhai et al.

(10) Patent No.: US 10,631,430 B2
(45) Date of Patent: Apr. 21, 2020

(54) TOP COVER ARRANGEMENT FOR A STORAGE AND THE CORRESPONDING STORAGE

(71) Applicant: EMC IP Holding Company LLC, Hopkinton, MA (US)

(72) Inventors: Haifang Zhai, Shanghai (CN); Yujie Zhou, Shanghai (CN); Qingqiang Guo, Shanghai (CN); Weidong Zuo, Shrewsbury, MA (US); Wenjin Seraph Xu, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/846,311

(22) Filed: Dec. 19, 2017

(65) Prior Publication Data

US 2018/0177068 A1  Jun. 21, 2018

(30) Foreign Application Priority Data

Dec. 21, 2016  (CN) .......................... 2016 1 1192935

(51) Int. Cl.
*H05K 7/14* (2006.01)
*G11B 33/12* (2006.01)
*G06F 1/18* (2006.01)
*G06F 1/20* (2006.01)

(52) U.S. Cl.
CPC ......... *H05K 7/1487* (2013.01); *G11B 33/127* (2013.01); *G11B 33/128* (2013.01); *G06F 1/187* (2013.01); *G06F 1/20* (2013.01)

(58) Field of Classification Search
CPC ... H05K 7/1487; G11B 33/127; G11B 33/128
See application file for complete search history.

(56) References Cited

U.S. PATENT DOCUMENTS

| | | | | |
|---|---|---|---|---|
| 6,788,542 | B2 * | 9/2004 | Rumney | H05K 7/1421 361/724 |
| 7,646,590 | B1 * | 1/2010 | Corhodzic | H05K 7/1492 361/622 |
| 9,055,689 | B2 * | 6/2015 | Yu | H05K 5/0226 |
| 2010/0007252 | A1 * | 1/2010 | Liu | G06F 1/183 312/223.2 |
| 2010/0118484 | A1 * | 5/2010 | Sasagawa | G06F 1/20 361/679.37 |
| 2010/0172087 | A1 * | 7/2010 | Jeffery | G11B 33/02 361/679.33 |
| 2011/0163642 | A1 * | 7/2011 | Rohrbach | A45C 9/00 312/223.1 |

(Continued)

*Primary Examiner* — Abhishek M Rathod
(74) *Attorney, Agent, or Firm* — Brian J. Colandreo; Mark H. Whittenberger; Holland & Knight LLP (57) ABSTRACT

Embodiments of the present disclosure provide a top cover arrangement for a storage and the corresponding storage. The storage comprises a drawer chassis which accommodates disks that are organized among a plurality of rows. The top cover arrangement covers the disks in a foldable manner and comprises: a substrate covering the disks and being flexible; and a plurality of folding parts mounted on the substrate and corresponding to the plurality of the rows; the folding parts being adapted to be at least partially folded to expose at least one row of disks in response to the disks being pulled out of the drawer chassis.

19 Claims, 10 Drawing Sheets

(56) References Cited

U.S. PATENT DOCUMENTS

| | | | | |
|---|---|---|---|---|
| 2012/0300383 A1* | 11/2012 | Lauder | ................ | G06F 1/1647 |
| | | | | 361/679.26 |
| 2013/0099645 A1* | 4/2013 | Hsieh | ................ | H05K 7/1487 |
| | | | | 312/326 |
| 2013/0233762 A1* | 9/2013 | Balaji | ................ | B65D 25/00 |
| | | | | 206/736 |
| 2014/0293534 A1* | 10/2014 | Siddiqui | ................ | E05D 7/00 |
| | | | | 361/679.55 |

\* cited by examiner

TOP COVER ARRANGEMENT FOR A STORAGE AND THE CORRESPONDING STORAGE

RELATED APPLICATIONS

This application claim priority from Chinese Patent Application Number CN201611192935.X, filed on Dec. 21, 2016 at the State Intellectual Property Office, China, titled "TOP COVER FOR USE IN STORAGE AND ASSOCIATED STORAGE" the contents of which is herein incorporated by reference in its entirety.

FIELD

Embodiments of the present disclosure generally relate to the field of storage, and more specifically, to a top cover arrangement for a storage and the corresponding storage.

BACKGROUND

In the design and utilization of the disk array enclosure (abbreviated as DAE), one of the challenges is that the time allowing the service engineer to expand and/or replace disks (for example, including, but not limited to, magnetic disk, compact disk, hard disk and U disk and so on) is very short. The heat dissipating effect will deteriorate when the disk is pulled out of the drawer chassis, which limits the time for the service engineer to expand and/or replace disks. For example, if the time for the service engineer to expand and/or replace disks is too long, the disk might be damaged. Therefore, it is necessary to find an economic and easy-to-implement technique that can prolong time for the service engineer to expand and/or replace disks.

SUMMARY

Various implementations of the present disclosure provide a top cover arrangement for a storage and the corresponding storage to solve the above and other potential problems of the prior art at least in part.

In one aspect of the present disclosure, there is provided a top cover arrangement for a storage which includes a drawer chassis that accommodates disks that are organized in a plurality of rows. The top cover arrangement covers the disk in a foldable manner and includes: a substrate covering the disk and being flexible; and a plurality of folding parts mounted on the substrate and corresponding to a plurality of rows; the folding parts adapted to be at least partially folded to expose at least one row of the disks in response to the disk being pulled out of the drawer chassis.

In another aspect of the present disclosure, there is provided a storage, comprising: a drawer chassis comprising at least one midplane arranged perpendicular to a pulling direction of the drawer chassis, and accommodating disks that are organized in a plurality of rows and placed against the corresponding midplane; a fan accommodated in the drawer chassis and close to a distal end of the drawer chassis, the fan being arranged along a direction perpendicular to the pulling direction and generating suction air for dissipating heat from the disks; and a top cover arrangement for the storage according to the one aspect of the present disclosure.

BRIEF DESCRIPTION OF THE DRAWINGS

Implementations of the present disclosure are described with reference to the accompanying drawings only by way of example, in which.

DETAILED DESCRIPTION OF EMBODIMENTS

Implementations of the present disclosure will be described with reference to the drawings in detail. It should be noted that similar components or function modules may be represented with the same number in the drawings. The appended drawings only intend to depict the implementations of the present disclosure. Without departing from the spirit and scope of protection of the present disclosure, those skilled in the art can obtain alternative implementations from the following depiction.

During the operation of the conventional storage, the disk is accommodated in the drawer chassis; and the air flow (such as the suction air generated by the fan in the drawer chassis), limited by the drawer chassis (for example, direction of the air flow is limited), produces heat dissipating effect for the disks. If the disk is pulled out of the drawer chassis at this moment, the disk will be exposed in the air. As the air flow is not limited by a drawer chassis, the air flow through the disk will be reduced significantly, thus impacting the heat dissipating effect for the disk. More gravely, since the fan is generally fixed in the drawer chassis, if the disk is pulled out of the drawer chassis, then the distance between the fan and the disk will become relatively far, and heat dissipating effect of the fan for the disks will be impacted.

Figure 1:
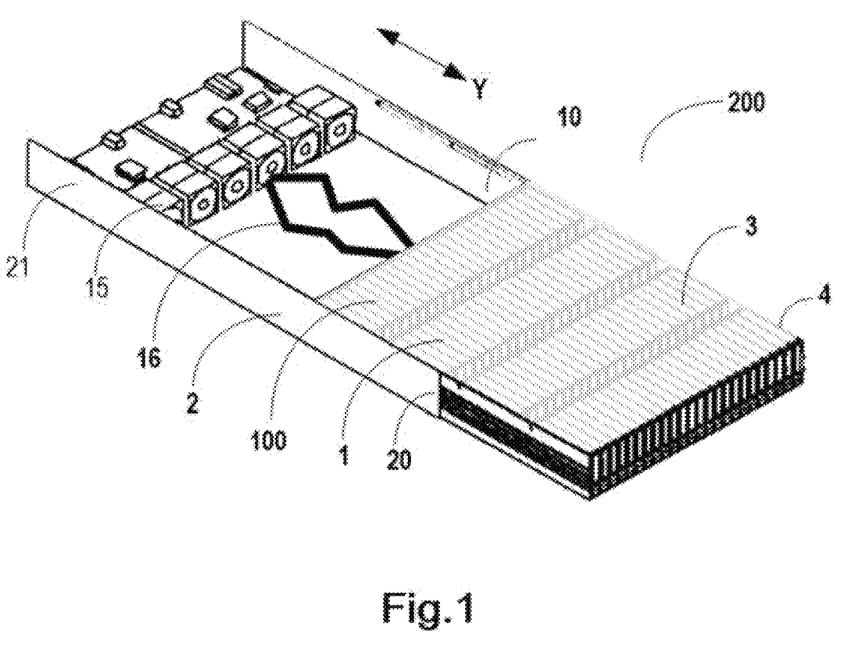
FIG. 1 illustrates a structural schematic diagram of the storage according to the implementations of the present disclosure.

Implementations of the present disclosure can solve one or more of the above problems. As shown in FIG. 1, implementations of the present disclosure provide a storage 200 comprising: a drawer chassis 2, a fan 15 and a top cover arrangement 100. The drawer chassis 2 includes at least one midplane 10 arranged perpendicular to a pulling direction Y of the drawer chassis 2. The drawer chassis 2 is used to accommodate disks 3 that are generally organized in a plurality of rows 4 (such as forming a disk array 1) and placed against the corresponding midplane. As a rule, fan 15 is accommodated inside the drawer chassis 2 and close to a distal end 21 of the drawer chassis 2. The fan 15 is arranged along a direction perpendicular to the pulling direction Y and generates a suction air for dissipating heat from disks 3.

Figure 2:
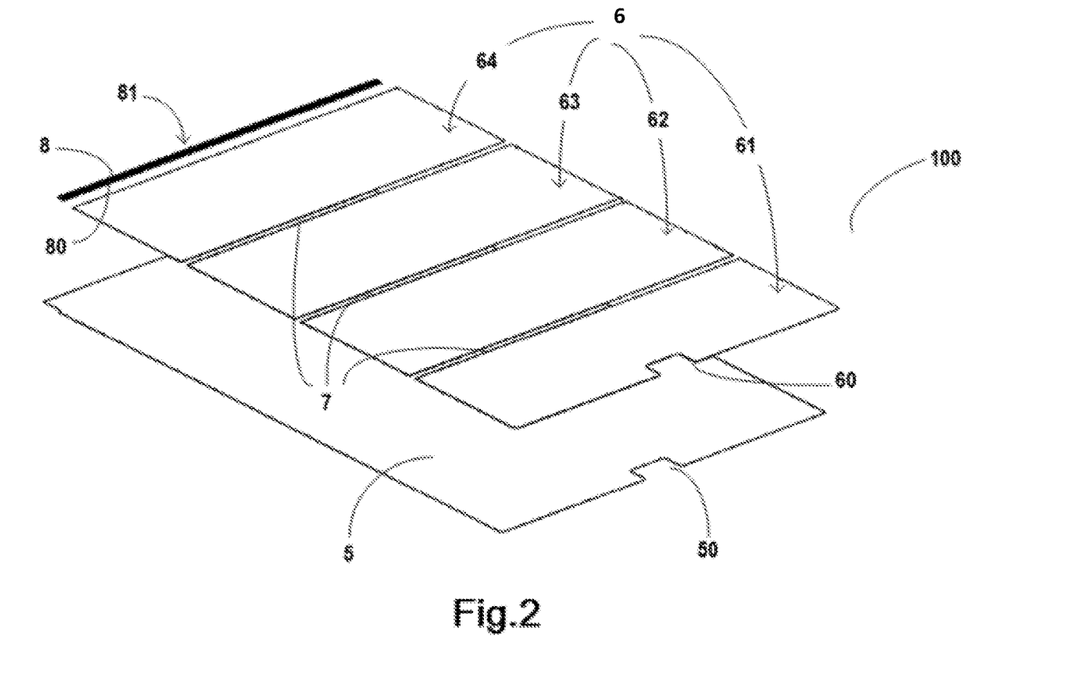
FIG. 2 illustrates an exploded structural schematic diagram of the top cover arrangement according to the implementations of the present disclosure.
Figure 5:
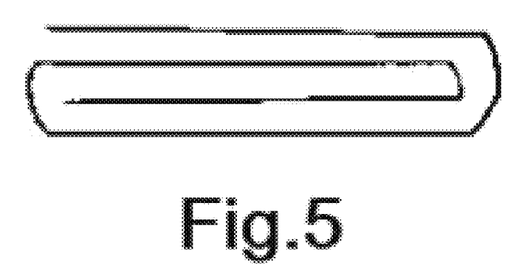
FIG. 5 illustrates an overall structural schematic diagram of the top cover arrangement according to FIG. 2 when fully folded.

Now, various example implementations of the top cover arrangement 100 of the present disclosure are described in detail. As shown in FIGS. 1-2, generally, the top cover arrangement 100 covers the disk 3 in a foldable manner. The top cover arrangement 100 includes a substrate 5 which covers disk 3 and is flexible. The top cover arrangement 100 further includes a plurality of folding parts 6 which are mounted on substrate 5 and correspond to a plurality of rows 4. The folding parts 6 are adapted to be at least partially folded (as shown in FIG. 5) to expose at least one row of the disks 3 in response to disks 3 being pulled out of the drawer chassis 2.

In this way, when disks 3 are pulled out of the drawer chassis 2, the folding parts 6 can be folded at least in part to expose at least one row of disks 3. Thus, it can be ensured that disks 3 in other rows will not be exposed when it is necessary to expand and/or replace disks 3 in at least one row of disks, so that the air flow can be limited by the folding part 6 above disks 3 in other rows, which can maintain heat dissipation for disks 3 in other rows advantageously, prevent damage caused by too high temperature and prolong the time for the service engineer to expand and/or replace disks 3.

For example, FIG. 1 illustrates disks 3 organized in four rows 4, each row of disks 3 including a plurality of disks 3 and each row of disks 3 being covered in the top cover arrangement 100. For example, the top cover arrangement 100 can be a plate in the form of a strip, where the number of the folding parts 6 is the same as the number of a plurality of rows 4. For example, the number of folding parts 6 shown in FIG. 1 is four, corresponding to the number of a plurality of rows 4. When the disks 3 are pulled out of the drawer chassis 2, the folding parts 6 can be folded to expose, for instance, one row, two rows or three rows of disks 3, or continue to be folded so as to be lifted as a whole to expose four rows of disks 3, thereby expanding and/or replacing disks 3 in the corresponding rows.

Figure 4:
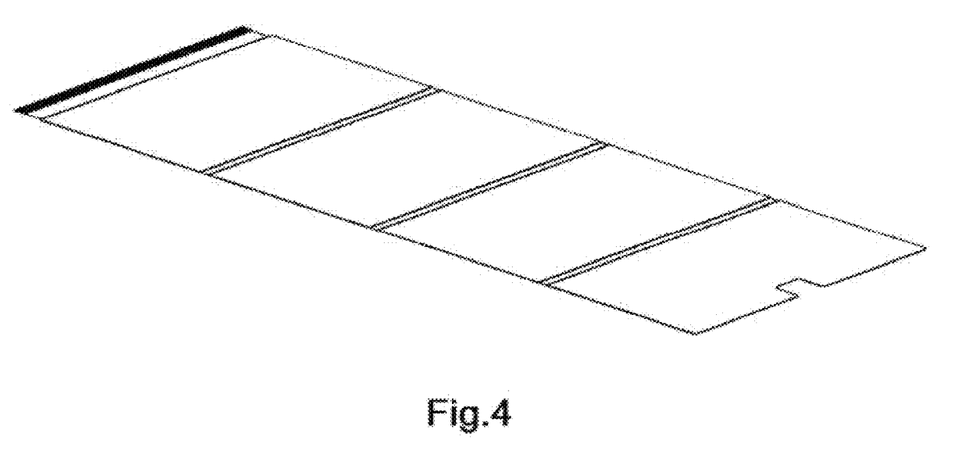
FIG. 4 illustrates an overall structural schematic diagram of the top cover arrangement according to FIG. 2 when fully unfolded.

As shown in FIG. 2, according to an implementation of the present disclosure, a plurality of folding parts 6 are mounted on substrate 5 abreast along the pulling direction Y of the drawer chassis 2 and located within the scope of the substrate 5. In this implementation, the plurality of folding parts 6 mounted abreast on substrate 5 are located within the scope of the substrate 5 (as shown in FIGS. 2 and 4), thereby the plurality of folding parts 6 can be folded (as shown in FIG. 5) with each other to facilitate expanding and/or replacing disks 3.

For example, FIG. 2 illustrates that four folding parts 6 are mounted (such as adhered) on substrate 5 abreast along the pulling direction Y of the drawer chassis 2 and located within the scope of the substrate 5. It should be noted that any specific number or numerical value described herein is only exemplary, with no intent to limit the scope of the present disclosure in any manner.

As shown in FIG. 2, according to an implementation of the present disclosure, a notch 50 (called as "a first notch") is arranged at the substrate 5 and close to a proximal end 20 of the drawer chassis 2. A corresponding notch 60 (called as "a second notch") is arranged on a first folding part 61 of the plurality of folding parts 6 close to the proximal end 20 of the drawer chassis 2. During the operation, the first notch 50 and the second notch 60 are matched with each other to facilitate lifting the top cover arrangement 100 in use. In this implementation, the first notch 50 and the second notch 60 enable the user, for instance, with a finger, to lift the top cover arrangement 100 (as shown in FIG. 4), thereby facilitating expanding and/or replacing disks 3.

The proximal end 20 of the drawer chassis 2 herein refers to an end of the drawer chassis 2 close to the user, as shown in FIG. 2. For example, the service engineer would perform the pulling action at the exit of the drawer chassis 2. For example, the first notch 50 and the second notch 60 shown in FIG. 2 can overlap (for instance, in a U-shape, as shown in FIG. 4) after being matched with each other to enable, for instance, the service engineer to stick finger therein so as to lift the top cover arrangement 100.

As shown in FIG. 2, according to an implementation of the present disclosure, the first folding part 61 of the plurality of folding parts 6 that is close to a proximal end 20 of the drawer chassis 2 has a dimension smaller than that of further folding parts 62, 63 and 64 of the plurality of folding parts 6. In this implementation, the dimension of further folding parts 62, 63 and 64 can be the same, thereby achieving even distribution. Only as an example, in an implementation, the dimension of substrate 5 can be configured as 538 mm*420 mm*0.1 mm, the dimension of the first folding part 61 can be configured as 420 mm*117 mm*0.4 mm, and the dimension of other folding parts 62, 63 and 64 can be configured as 420 mm*126 mm*0.4 mm. Without doubt, depending on the specific requirement and application scenario, any other dimension is also feasible.

Figure 3:
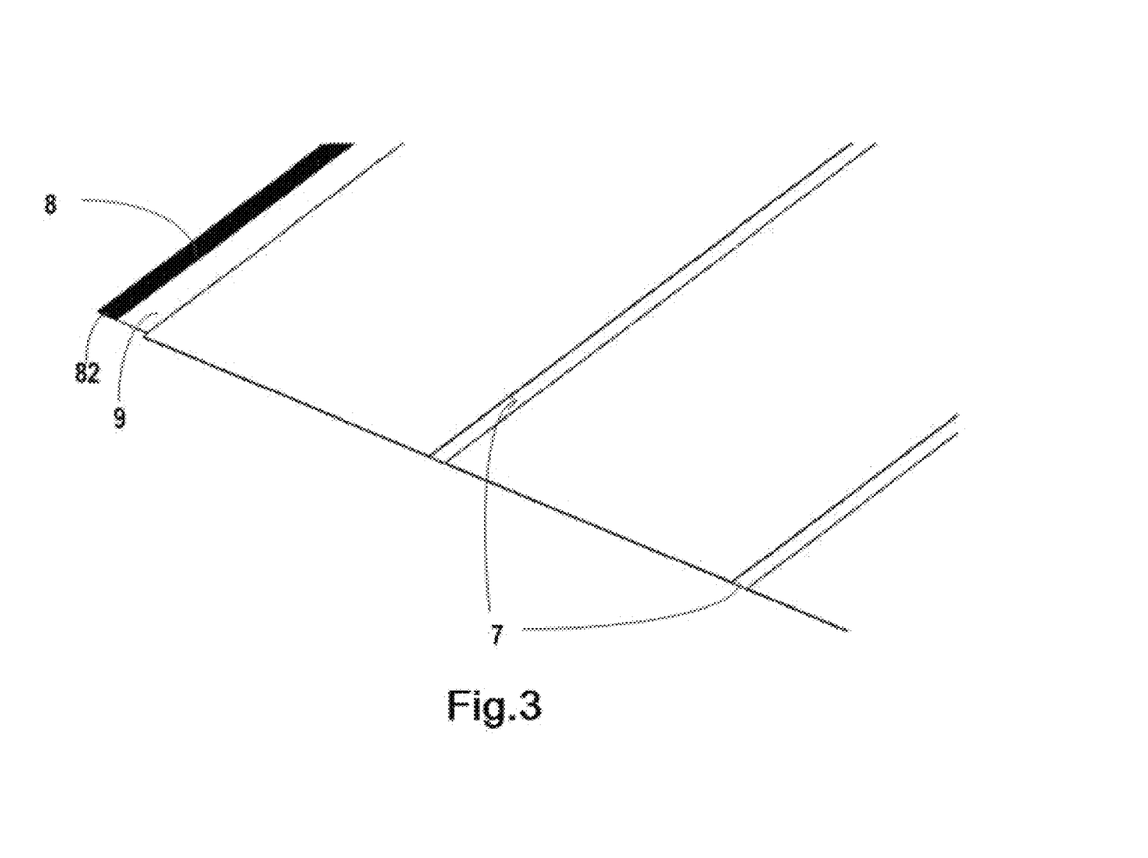
FIG. 3 illustrates a partial structural schematic diagram of the top cover arrangement according to FIG. 2.

As shown in FIGS. 2-3, according to an implementation of the present disclosure, the top cover arrangement 100 further includes: a first link part 7 arranged between the plurality of folding parts 6 to enable the plurality of folding parts 6 to be folded with one another. In such an implementation, the first link part 7 can achieve the function similar to that of a hinge so that the plurality of folding parts 6 can be folded with each other. For example, the first link part 7 shown in FIG. 2 takes the form of a long strip and its width can be configured as 7 mm. Definitely, depending on the specific requirement and application scenario, any other dimension is also feasible.

As shown in FIGS. 2-3, according to an implementation of the present disclosure, the top cover arrangement 100 further includes a joint part 8 which mounts the second folding part 64 of the plurality of folding parts 6 that is close to the distal end 21 of the drawer chassis 2 to the distal end 21 of the drawer chassis 2. In this implementation, the second folding part 64 can be mounted to the distal end 21 of the drawer chassis 2 via the joint part 8, so that the top cover arrangement 100 as a whole can be mounted on the drawer chassis 2 at one end to make the top cover arrangement 100 as a whole stable.

For example, the distal end 21 of the drawer chassis 2 is the end of the drawer chassis 2 away from the user (for example, the service engineer would normally perform pulling action at the exit of the drawer chassis 2), as indicated in FIG. 2. For example, the joint part 8 takes the form of a long strip, and its one end 80 is connected to one side of the second folding part 64 and the other end 81 is mounted to the distal end 21 of the drawer chassis 2. Only as an example, the length and width of joint part 8 can be configured as 412 mm and 8 mm, respectively. Of course, depending on the specific requirement and application scenario, any other dimension is also possible.

According to an implementation of the present disclosure, the bottom 82 of the joint part 8 is adhered to the substrate 5 and jointed to the second folding part 64 via the second link part 9. In such an implementation, the second link part 9 can achieve the function similar to that of a hinge, so that the second folding part 64 can be lifted with respect to the drawer chassis 2 (as shown in FIG. 4). For example, the second link part 9 can take the form of a long strip with a width of 14 mm, for instance. Of course, depending on the specific requirement and application scenario, any other dimension is also feasible.

With reference to FIGS. 1 and 2, according to an implementation of the present disclosure, the drawer chassis 2 includes at least one midplane 10 which is arranged perpendicular to the pulling direction Y of the drawer chassis 2, and the midplane is used to separate a plurality of rows 4 and is covered by a plurality of folding parts 6. In such an implementation, the midplate 10 can separate a plurality of rows of disks, and the midplane 10 can be covered with the corresponding folding parts 6 above so that the folding parts 6 can cover the disks of the corresponding rows to limit the flow direction of the air flow.

According to an implementation of the present disclosure, the substrate 5 is made of polyester and the plurality of folding parts 6 are polycarbonate membrane. In such an implementation, the substrate 5 made of polyester has high flexibility and is easy to fold and lift, while the plurality of folding parts 6 of polycarbonate membrane have low flexibility (such as having a certain hardness) and can cover disks of a corresponding row. For example, the plurality of folding parts 6 is supported on the corresponding midplane 10 and maintains a distance with disks 3.

For example, as the top cover arrangement of the present disclosure combines two different materials (namely, a substrate 5 made of polyester and folding parts 6 made of polycarbonate membrane), it is possible to achieve the technical effect of being folded easily.

According to an implementation of the present disclosure, the top cover arrangement 100 can be switched among a plurality of states. For example, in the state that the top cover arrangement 100 is completely pushed into the drawer chassis 2, the top cover arrangement 100 covers on the disks 3. In the state that the top cover arrangement 100 is pulled out of drawer chassis 2 without the disks 3 being required to be expanded and/or replaced, the top cover arrangement 100 covers on disks 3. In the state that top cover arrangement 100 is pulled out of drawer chassis 2 with the disks 3 being required to be expanded and/or replaced, the top cover arrangement 100 is lifted to fold at least a part of the plurality of folding parts 6 so as to expose at least one row of disks 3. With the operation of the user, the top cover arrangement 100 can be configured in the corresponding state.

In such an implementation, if the top cover arrangement 100 is completely pushed into the drawer chassis 2, then it is usually not able to expand and/or replace disks. Hence, the top cover arrangement covering on disks 3 will limit the flow direction of the air flow. If the top cover arrangement 100 is pulled out and it is not necessary to expand and/or replace disks (such as only observing the top cover arrangement), then the top cover arrangement covering on disks 3 will limit the flow direction of air flow. If the top cover arrangement 100 is pulled out and it is necessary to expand and/or replace disks, then the top cover arrangement 100 can be lifted to expose at least one row of disks 3, thereby facilitating expanding and/or replacing disks without influencing the heat dissipating effect of disks in other rows.

Figure 6:
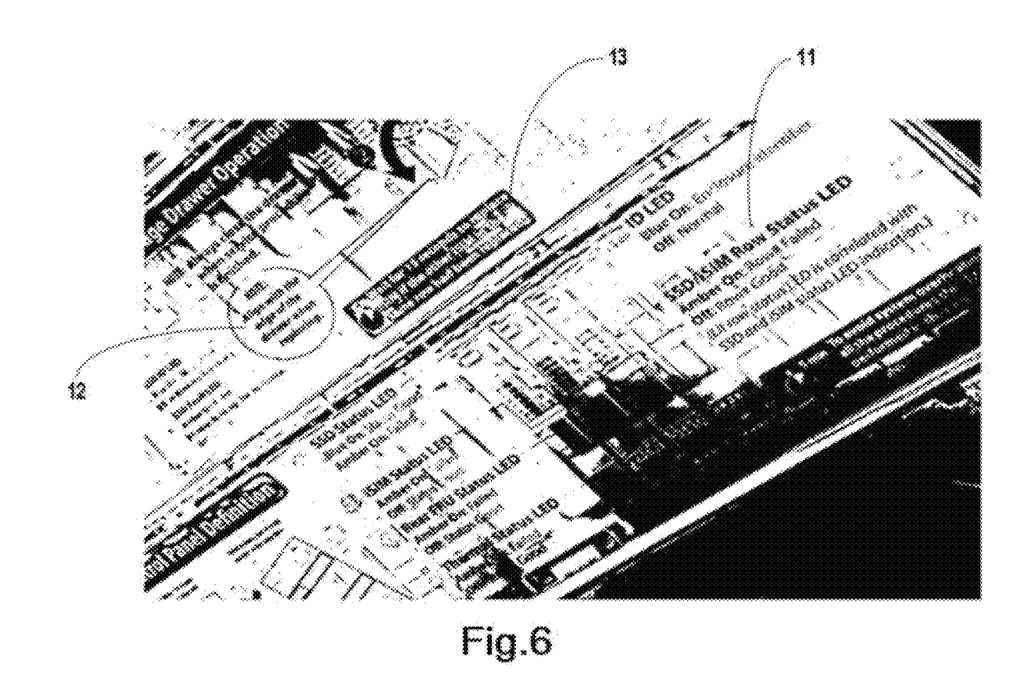
FIG. 6 illustrates a schematic diagram of the indicator on the top cover arrangement according to FIG. 2.
Figure 7:
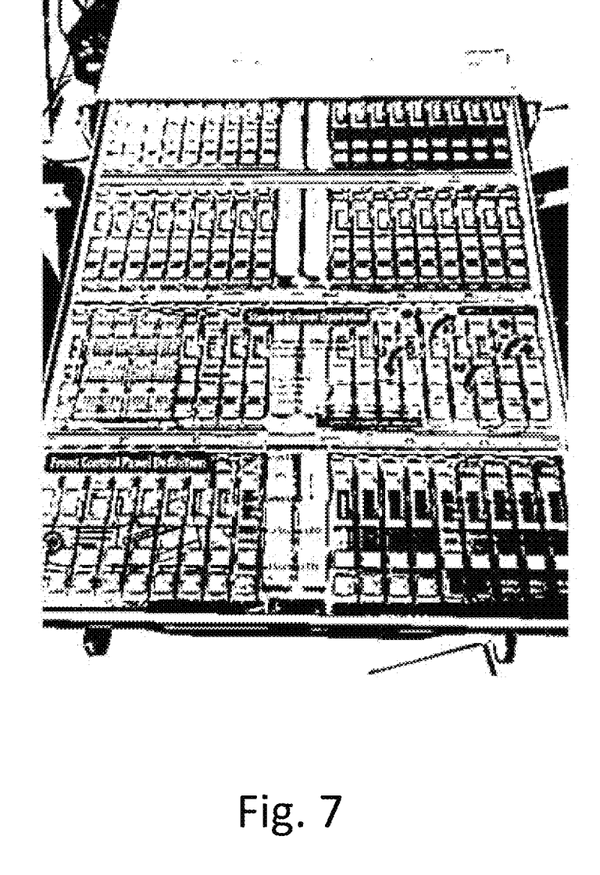
FIG. 7 illustrates a schematic diagram of the indicator on the top cover arrangement according to FIG. 2.

As shown in FIGS. 6-7, according to an implementation of the present disclosure, the top cover arrangement 100 further includes at least one of the following: a functional indicator 11 indicating the functional state of disks 3; an operational indicator 12 promoting user's operation manner; and a warning indicator 13 providing warning information.

In such an implementation, various indicators can be configured on the top cover arrangement 100, thereby achieving the effect of functional indication (such as indicating the numerical number or function of the disk or indicating function of the LED light showing the current state of the disk), operational indication (such as indicating the manner of operation, for example, aligning the edges of the drawers when the disk is replaced) or a warning indication (such as WARNING).

Through the above description, it will be appreciated that according to the implementations of the present disclosure, drawer chassis 2 can be pulled out when it is necessary to expand and/or replace disk 3 in at least one row of disks. Then the folding parts 6 can be folded at least in part to expose disk 3 in at least one row of disks such that when it is necessary to expand and/or replace disk 3 in at least one rows of disks, the disk 3 in other rows will not be exposed in order that the air flow can be limited by folding parts 6 above disk 3 in other rows to dissipate heat from disk 3 in other rows and prevent damage caused by high temperature and prolong time for service engineer to expand and/or replace disk 3.

For example, the circuit for mounting fan 15 and the disk array 1 can be connected with each other via cable 16, so that when the disk 3 in the disk array 1 is pulled out of the drawer chassis 2, it can still be electrically connected with the corresponding circuit (such as the control circuit) in the drawer chassis 2. Cable 16 has some flexibility and thus, can maintain flexibility during the pulling process of the disk array 1.

Figure 8:
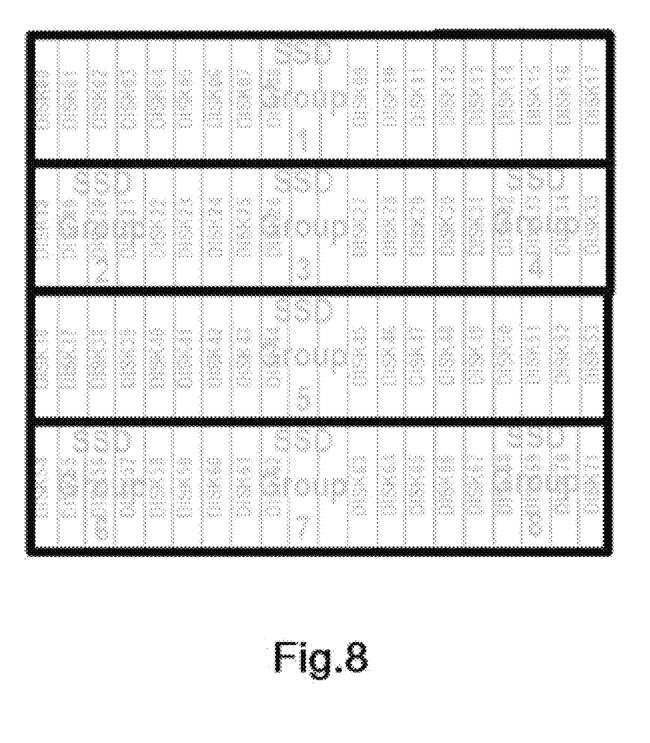
FIG. 8 illustrates a structural diagram of the top cover arrangement and the disk of the corresponding group in a first comparative example.
Figure 9:
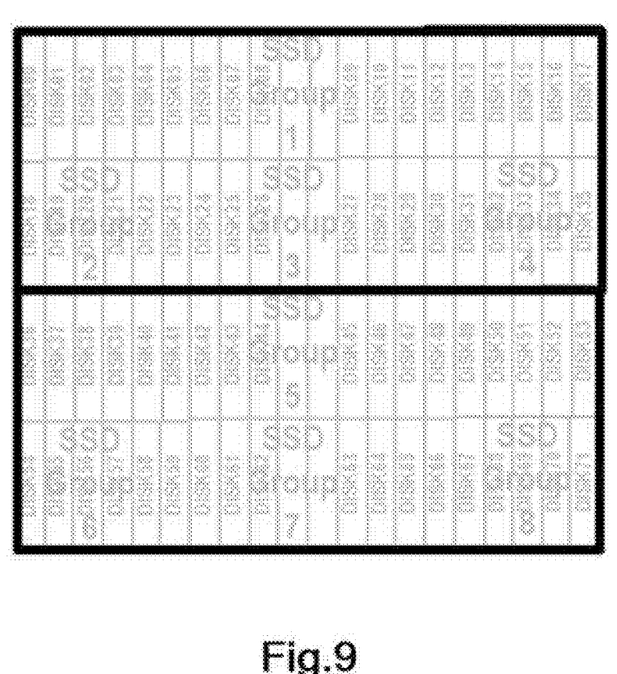
FIG. 9 illustrates a structural diagram of the top cover arrangement and the disk of the corresponding group in a second comparative example.
Figure 10:
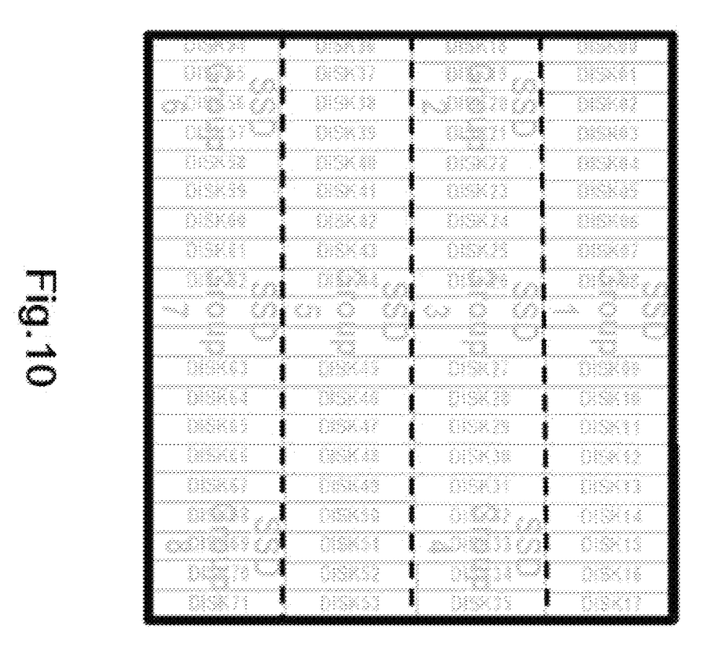
FIG. 10 illustrates a structural diagram of the top cover arrangement and the disk of the corresponding group according to the example implementations of the present disclosure.

Next, with reference to FIGS. 8-10, the advantage of the top cover arrangement structure in the example implementation according to the present disclosure over top cover arrangements of other structures will be described in detail. FIG. 8 illustrates a structural diagram of the top cover arrangement in the first comparative example and the disk in the corresponding group; FIG. 9 illustrates a structural diagram of the top cover arrangement in the second comparative example and the disk in the corresponding group; and FIG. 10 illustrates a structural diagram of the top cover arrangement according to the example implementations of the present disclosure and the disk in the corresponding group.

A First Comparative Example

As shown in FIG. 8, in the first comparative example, the top cover arrangement has 4 individual cover pieces, each cover piece covering a row of disks, wherein four rows with 72 disks in total are separated into eight groups (where the disk is represented by DISK# and the group is represented by SSD Group#). Take the expansion disk as an example to illustrate the first comparative example, where the expansion of disks is completed based on grouping. For example, if there is only group 1, then it can be expanded to group 1+group 2. The top cover arrangement of this structure in the first comparative example can achieve the function as shown in Table 1 (where symbol ":" represents "to", "+" represents expansion and the number represents the mark number of the group).

TABLE 1

| Expanding based on group | whether can achieve heat dissipating effect |
| --- | --- |
| +2 or +2:3 or +2:4 | yes |
| +3 or +3:4 | yes |

TABLE 1-continued

| Expanding based on group | whether can achieve heat dissipating effect |
|---|---|
| +5 | yes |
| +6 or +6:7 or +6:8 | yes |
| +7 or +7:8 | yes |

As shown in Table 1, as four individual cover pieces are employed, when only group 1 exists (covered by an individual cover piece to achieve heat dissipating effect), it can be expanded to group 2, group 2 to group 3, or group 2 to group 4 (under this condition, it can be expanded without affecting heat dissipation of group 1; and after expansion, an individual cover piece can be used for coverage to achieve heat dissipating effect).

When there only exist group 1+group 2 (covered by two individual cover pieces to achieve heat dissipating effect), it can be expanded to group 3, or group 3 to group 4 (then it can be expanded by lifting the cover piece above group 2 without affecting heat dissipation of group 1; and after expansion, the cover piece can cover group 2 and the expanded group).

When there exist only group 1-group 4, it can be expanded to group 5 (then it can be expanded without affecting heat dissipation of group 1-group 4; and after expansion, an individual cover piece can be used for coverage to achieve the heat dissipating effect).

When there exist only group 1-group 5, it can be expanded to group 6, group 6 to 7, or group 6 to 8 (then it can be expanded without affecting heat dissipation of group 1-group 5; and after expansion, an individual cover piece can be used for coverage to achieve the heat dissipating effect).

When there exist only group 1-group 6, it can be expanded to group 7, or group 7-8 (then it can be expanded by lifting the cover piece above group 6 without affecting heat dissipation of group 1-group 5; and after expansion, the cover piece covers group 6 and the expanded group).

Thus, though all the expansion actions can be achieved by the top cover arrangement with four individual cover pieces, since the four individual cover pieces are separated from each other, their positions are easily moved and cannot cover the disk stably, which presents a disadvantage.

A Second Comparative Example

As shown in FIG. 9, in the second comparative example, the top cover arrangement has two individual cover pieces (compared with the first comparative example, the dimension of a cover piece in the second comparative example is two times the dimension of a cover piece in the first comparative example, and thus can cover two rows of disks), where four rows with 72 disks in total are separated into eight groups. Take the expansion disk as an example to illustrate the second comparative example, where the expansion of disks is completed based on grouping. For example, if there is only group 1, then it can be expanded to group 1+group 2. The top cover arrangement of this structure in the second comparative example can achieve the function as shown in Table 2 (where symbol ":" represents "to", "+" represents expansion and the number represents the mark number of the group).

TABLE 2

| Expanding based on group | whether can achieve heat dissipating effect |
|---|---|
| +2 or +2:3 or +2:4 | no |
| +3 or +3:4 | no |
| +5 | yes |
| +6 or +6:7 or +6:8 | no |
| +7 or +7:8 | no |

As shown in Table 2, since two individual cover pieces are employed, each cover piece covers two rows of disks:

When there only exist group 1 (covered by an individual cover piece to achieve heat dissipating effect), if the cover piece above group 1 is lifted, heat dissipation of disks in group 1 will definitely be affected. Therefore, it cannot be expanded to group 2, group 2 to group 3, or group 2 to group 4.

When there only exist group 1+group 2 (covered by an individual cover piece to achieve heat dissipating effect), if the cover piece above group 1 is lifted, heat dissipation of disks in group 1 will definitely be affected. Therefore, it cannot be expanded to group 3, or group 3 to group 4.

When there only exist group 1-group 4, it can be expanded to group 5 (under this condition, it can be expanded without affecting heat dissipation of group 1-group 4; and after expansion, an individual cover piece can be used for coverage to achieve heat dissipating effect).

When there only exist group 1-group 5, if the cover piece above group 5 is lifted, heat dissipation of disks in group 5 will definitely be affected. Therefore, it cannot be expanded to group 6, group 6-group 7, or group 6-group 8.

When there only exist group 1-group 6, if the cover piece above group 6 is lifted, heat dissipation of disks in group 5 will definitely be affected. Thus, it cannot be expanded to group 7, or group 7 to group 8.

Hence, compared with the first comparative example, the top cover arrangement of this structure in the second comparative example has less favorable heat dissipation effect and the position is easy to move such that it cannot cover the disk stably. Generally speaking, it does not have sound practical applicability.

Implementations of the Present Disclosure

As shown in FIG. 10, in the implementations of the present disclosure, the top cover arrangement has four foldable folding parts, each folding part covering a row of disks, where four rows with 72 disks in total are separated into eight groups. Take the expansion disk as an example to illustrate the implementations of the present disclosure, where the expansion of the disks is completed based on grouping. For example, if there is only group 1, then it can be expanded to group 1+group 2. The top cover arrangement of this structure in the implementations of the present disclosure can achieve the function as shown in Table 3 (where symbol ":" represents "to", "+" represents expansion and the number represents the mark number of the group).

TABLE 3

| Expanding based on group | whether can achieve heat dissipating effect |
|---|---|
| +2 or +2:3 or +2:4 | yes |
| +3 or +3:4 | yes |
| +5 | yes |
| +6 or +6:7 or +6:8 | yes |
| +7 or +7:8 | yes |

As shown in Table 3, since four foldable folding parts are employed, each folding part only covers a row of disks:

When only group 1 exists (covered by a folding part to achieve heat dissipating effect), it can be expanded to group 2, group 2 to group 3, or group 2 to group 4 (under this condition, it can be expanded without affecting heat dissipation of group 1; and after expansion, a folding part is used for coverage to achieve heat dissipating effect).

When there only exist group 1+group 2 (covered by two folding parts to achieve heat dissipating effect), it can be expanded to group 3, or group 3 to group 4 (then it can be expanded by lifting the folding part above group 2 without affecting heat dissipation of group 1; and after expansion, the folding part covers group 2 and the expanded group).

When there exist only group 1-group 4, it can be expanded to group 5 (then it can be expanded without affecting heat dissipation of group 1-group 4; and after expansion, a folding part can be used for coverage to achieve the heat dissipating effect).

When there exist only group 1-group 5, it can be expanded to group 6, group 6 to 7, or group 6 to 8 (then it can be expanded without affecting heat dissipation of group 1-group 5; and after expansion, an individual cover piece can be used for coverage to achieve the heat dissipating effect).

When there exist only group 1-group 6, it can be expanded to group 7 or group 7-8 (then it can be expanded by lifting the folding part above group 6 without affecting heat dissipation of group 1-group 5; and after expansion, the folding part covers group 6 and the expanded group).

Therefore, compared with the first comparative example and the second comparative example, the implementations of the present disclosure, owing to the top cover arrangement with four folding parts, can achieve all of the expanding actions. Meanwhile, as four folding parts can be folded with each other, and, for example, can be fixed in a drawer chassis at one end, they can cover the disk stably. When it is necessary to expand and/or replace disks, the operation can be implemented only by lifting or folding the top cover arrangement, thereby prolonging the operation time for the service engineer, which presents a less costly method with more practical applicability.

Through the above comparison, it can be seen that the top cover arrangement in the implementations of the present disclosure can achieve multiple advantages, including but not limited to: the top cover arrangement according to the present disclosure can be used in a disk array enclosure (such as a next-generation XtremIO hardware) to lengthen time for the service engineer to expand and/or replace disks after pulling out the drawer chassis in order to meet the heat dissipating requirement of the disk (for example, to ensure that the temperature when the disk is pulled out of the drawer chassis is no higher than 40° C.).

Through the above depiction and the teaching given by the drawings, many modifications and other implementations of the present disclosure can be realized by those skilled in the art related to the present disclosure. Therefore, it is to be understood that the implementations of the present disclosure are not limited to the specific implementations disclosed herein, and the modifications and other implementations are intended to be included in the scope of the present disclosure. Furthermore, though the above depiction and associated drawings describe the example implementations under the context of some example combinations of components and/or functions, it should be realized that alternative implementations can provide different combinations of components and/or functions without departing from the scope of the present disclosure. In this respect, for example, other forms of combinations of components and/or functions different from those described explicitly above are also expected to be included in the scope of the present disclosure. Although specific terms are employed here, they are used in a general and descriptive sense rather than for limiting purpose.

We claim:

1. A top cover for a disk drive storage unit comprising: a flexible substrate; and
a plurality of folding parts mounted on the flexible substrate, wherein the plurality of folding parts are configured to be at least partially folded,
wherein the disk drive storage unit comprises a drawer chassis with one or more midplanes arranged successively along a pulling direction of the drawer chassis and one or more disks in a plurality of rows, with each of the plurality of rows placed against a corresponding midplane;
wherein one or more folding parts of the plurality of folding parts correspond to one or more rows of the plurality of rows such that folding each of the one or more folding parts will expose a row of the plurality of rows which corresponds to that folding part while limiting air flow above at least one row of the plurality of rows of the one or more disks that is unexposed;
wherein the drawer chassis of the disk drive storage unit accommodates a fan, the fan being positioned between the plurality of rows of disks and a rearmost portion of the disk drive storage unit; and
wherein the plurality of rows and the fan are connected to each other via a cable configured to maintain an electrical connection between the drawer chassis and a corresponding circuit when one or more rows of the plurality of rows are being pulled out of the drawer chassis.

2. The top cover arrangement according to claim 1, wherein the plurality of folding parts are arranged abreast on the flexible substrate along the pulling direction of the drawer chassis and within the range of the flexible substrate.

3. The top cover arrangement according to claim 1, wherein a first notch is arranged at an edge of the flexible substrate closest to a front-most portion of the drawer chassis, a second notch is arranged on a folding part of the plurality of folding parts closest to the front-most portion of the drawer chassis, and the first notch and the second notch are matched with each other to facilitate lifting the top cover arrangement in use.

4. The top cover arrangement according to claim 1, wherein a first folding part of the plurality of folding parts that is closest to the front-most portion of the drawer chassis has a dimension smaller than that of further folding parts of the plurality of folding parts.

5. The top cover arrangement according to claim 1, further comprising:
a first link part arranged between the plurality of folding parts to enable the plurality of folding parts to be folded with one another.

6. The top cover arrangement according to claim 1, further comprising:
a joint part for mounting a second folding part of the plurality of folding parts that is closest to a rear most portion of the drawer chassis to the rear-most portion of the drawer chassis.

7. The top cover arrangement according to claim 6, wherein a bottom of the joint part is adhered to the flexible substrate and jointed to the second folding part via a second link part.

8. The top cover arrangement according to claim 1, wherein the flexible substrate is made of polyester material, and the plurality of folding parts are polycarbonate membrane.

9. The top cover arrangement according to claim 1, wherein:
the top cover arrangement covers the plurality of rows of when the plurality of rows are fully pushed into the drawer chassis;
the top cover arrangement covers the plurality of rows when the plurality of rows are pulled out of the drawer chassis without exposing one or more disks of the one or more disks;
the top cover arrangement is lifted to fold at least a part of the plurality of folding parts so as to expose at least one row of the plurality of rows when the plurality of rows are pulled out of the drawer chassis to expand or replace one or more disks of the one or more disks.

10. The top cover arrangement according to claim 1, further comprising at least one of the following:
a functional indicator indicating the functional state of the disks;
an operational indicator promoting the user's operational manner; and
a warning indicator providing warning information.

11. A disk drive storage unit, comprising:
a drawer chassis comprising one or more midplanes arranged successively along a pulling direction of the drawer chassis, and accommodating one or more disks that are organized in a plurality of rows with each row placed against a corresponding midplane;
a fan accommodated in the drawer chassis and positioned between the plurality of rows and a rear-most portion of the disk drive storage unit, the fan being arranged along a direction perpendicular to the pulling direction and generating suction air for dissipating heat from the one or more disks; and
a top cover arrangement for the storage comprising:
a flexible substrate covering the one or more disks; and
a plurality of folding parts mounted on the flexible substrate such that each folding part corresponds to a row of the plurality of rows wherein the plurality of folding parts are configured to be at least partially folded to expose at least one row of the plurality of rows of one or more disks such that folding each folding part will expose the corresponding row of the plurality of rows in response to the disks being pulled out of the drawer chassis while limiting air flow above at least one row of the one or more disks that is unexposed, the plurality of rows and the fan being connected to each other via a cable configured to maintain an electrical connection between the drawer chassis and a corresponding circuit when one or more rows disks are pulled out of the drawer chassis.

12. The storage of claim 11, wherein the plurality of folding parts are arranged abreast on the flexible substrate along a pulling direction of the drawer chassis and within the range of the flexible substrate.

13. The storage of claim 11, wherein the top cover further comprises: a first notch arranged at an edge of the flexible substrate closest to a front-most portion of the drawer chassis, and a second notch arranged on a folding part of the plurality of folding parts closest to the front-most portion of the drawer chassis, wherein the first notch and the second notch are matched with each other to facilitate lifting the top cover arrangement in use.

14. The storage of claim 11, wherein the folding part of the plurality of folding parts that is closest to the front-most portion of the drawer chassis has a dimension smaller than that of at least one other folding part of the plurality of folding parts.

15. The storage of claim 11, wherein the top cover arrangement further comprises:
a first link part arranged between the plurality of folding parts to enable the plurality of folding parts to be folded with one another.

16. The storage of claim 11, wherein the top cover arrangement further comprises:
a joint part for mounting a rear-most folding part of the plurality of folding parts that is closest to a rear-most portion of the drawer chassis to the rear-most portion of the drawer chassis.

17. The storage of claim 16, wherein a bottom of the joint part is adhered to the flexible substrate and jointed to the rear-most folding part via a second link part.

18. The storage of claim 11, wherein the drawer chassis comprises at least one midplane which is arranged perpendicular to a pulling direction of the drawer chassis, the midplane is used to separate the plurality of rows and is covered by the plurality of folding parts.

19. The storage of claim 11, wherein the flexible substrate is made of polyester material, and the plurality of folding parts are polycarbonate membrane.

* * * * *